United States Patent [19]
Bonsaver et al.

[11] Patent Number: 5,175,021
[45] Date of Patent: Dec. 29, 1992

[54] TRANSMISSION LINE FOR PROVIDING POWER TO AN ELECTRODE BOAT IN A PLASMA ENHANCED CHEMICAL VAPOR DEPOSITION SYSTEM

[75] Inventors: Michael R. Bonsaver, Phoenix; Rand A. Conner, Chandler, both of Ariz.; David P. Lambert, Costa Mesa, Calif.

[73] Assignee: Advanced Semiconductor Materials America, Inc., Phoenix, Ariz.

[21] Appl. No.: 624,320

[22] Filed: Dec. 12, 1990

Related U.S. Application Data

[63] Continuation of Ser. No. 473,443, Feb. 1, 1990, abandoned.

[51] Int. Cl.⁵ ............................................. C23C 16/48
[52] U.S. Cl. .................................. 427/569; 118/723; 156/345
[58] Field of Search ............... 118/723, 50.1; 156/345; 427/39

[56] References Cited

U.S. PATENT DOCUMENTS

| | | | |
|---|---|---|---|
| 4,223,048 | 9/1980 | Engle | 427/39 |
| 4,610,748 | 9/1986 | Engle et al. | 156/345 |
| 4,799,451 | 1/1989 | Gardner | 118/500 |

*Primary Examiner*—Richard Bueker

[57] ABSTRACT

A transmission line is constructed from ceramic and nickel materials to provide a characteristic impedance that matches the characteristic impedance of a boat assembly in a chemical vapor deposition system. The transmission line is interposed between a set of feedthroughs through the wall of a reactant tube and a set of contacts on the boat assembly. The transmission line improves the efficiency of the power transfer to the boat assembly from an RF power source external to the reactant tube. The transmission line is particularly advantageous at high frequencies such as, for example, 13.56 MHz. This improves the repeatability of the deposition of film on wafers in the boat assembly.

13 Claims, 5 Drawing Sheets

TRANSMISSION LINE FOR PROVIDING POWER TO AN ELECTRODE BOAT IN A PLASMA ENHANCED CHEMICAL VAPOR DEPOSITION SYSTEM

This application is a continuation of U.S. patent application Ser. No. 473,443, filed Feb. 1, 1990.

BACKGROUND OF THE INVENTION

1. Field of the Invention

The present invention relates generally to an apparatus for processing semiconductor wafers, and, more particularly, relates to a wafer boat assembly or the like within externally excited, chemical, reaction systems wherein the reactant material flows over the wafers or workpieces.

2. Description of the Related Art

Plasma enhanced chemical vapor reactors are known in the art. U.S. Pat. No. 4,799,451, for example, provides general background information about such systems and describes an improved boat assembly for use with such systems. Additional details regarding the operation of such systems are provided in U.S. Pat. Nos. 4,223,048 and 4,610,748. U.S. Pat. Nos. 4,223,048, 4,610,748, and 4,799,451 are incorporated herein by reference.

As is known to the art, such chemical vapor reactors operate by applying an external voltage to the boat assembly within a reactor tube to cause gasses within the reactor tube to form a plasma that is exposed to the surfaces of the semiconductor wafers positioned in the boat assembly. The operation of the reactors result in the deposition of a film of material onto the wafers. Conventional reactors have used a voltage source having a frequency of approximately 55 KHz; however, there are advantages to using a significantly higher frequency, such as, for example, 13.56 MHz. On the other hand, the use of the higher frequency has resulted in operational problems when the higher frequency is incorporated into existing systems. In particular, it has been found that the power from the external voltage source is not efficiently provided to the boat assembly. As a result, the wafers in the boat assembly incur uneven deposition. In some cases, there is deposition of the film on the inner surfaces of the reactor tube, particularly in the vicinity of the electrical feedthroughs via which the high frequency voltage is brought into the tube and thus to the boat assembly. These are undesirable side effects of using the higher frequency voltage which outweigh the benefits for many users. Thus, a need exists to eliminate these side effects.

SUMMARY OF THE INVENTION

Applicants have discovered that the variable deposition of film on the wafers results from the inefficient delivery of power to the boat assembly. It is believed that the inefficient delivery results from transmission losses through the electrical cables supplying the power to the reactant tube and to the boat assembly within the reactant tube. The inefficient delivery is evidenced by the formation of a plasma proximate to the feedthroughs which results in the deposition of film proximate to the feedthroughs.

The present invention is an improvement by which power is delivered to the reactant tube and to the boat assembly within the reactant tube using transmission line techniques to preclude the loss of power along the delivery path. A transmission line is provided between the source of high frequency voltage and the reactant tube and a second transmission line is provided within the reactant tube to connect to the boat assembly. The impedance of the transmission line is selected to be substantially equal to the electrical impedance of the boat assembly at the selected operating frequency (e.g., 13.56 MHz) so that the electrical energy is efficiently transmitted to the boat assembly with minimal reflections and consequently minimal loss of power. Unlike the prior systems, there are no portions of the voltage delivery path having significant impedance mismatches that result in the generation of a plasma prior to the boat assembly.

DETAILED DESCRIPTION OF THE PREFERRED EMBODIMENT

Figure 1:
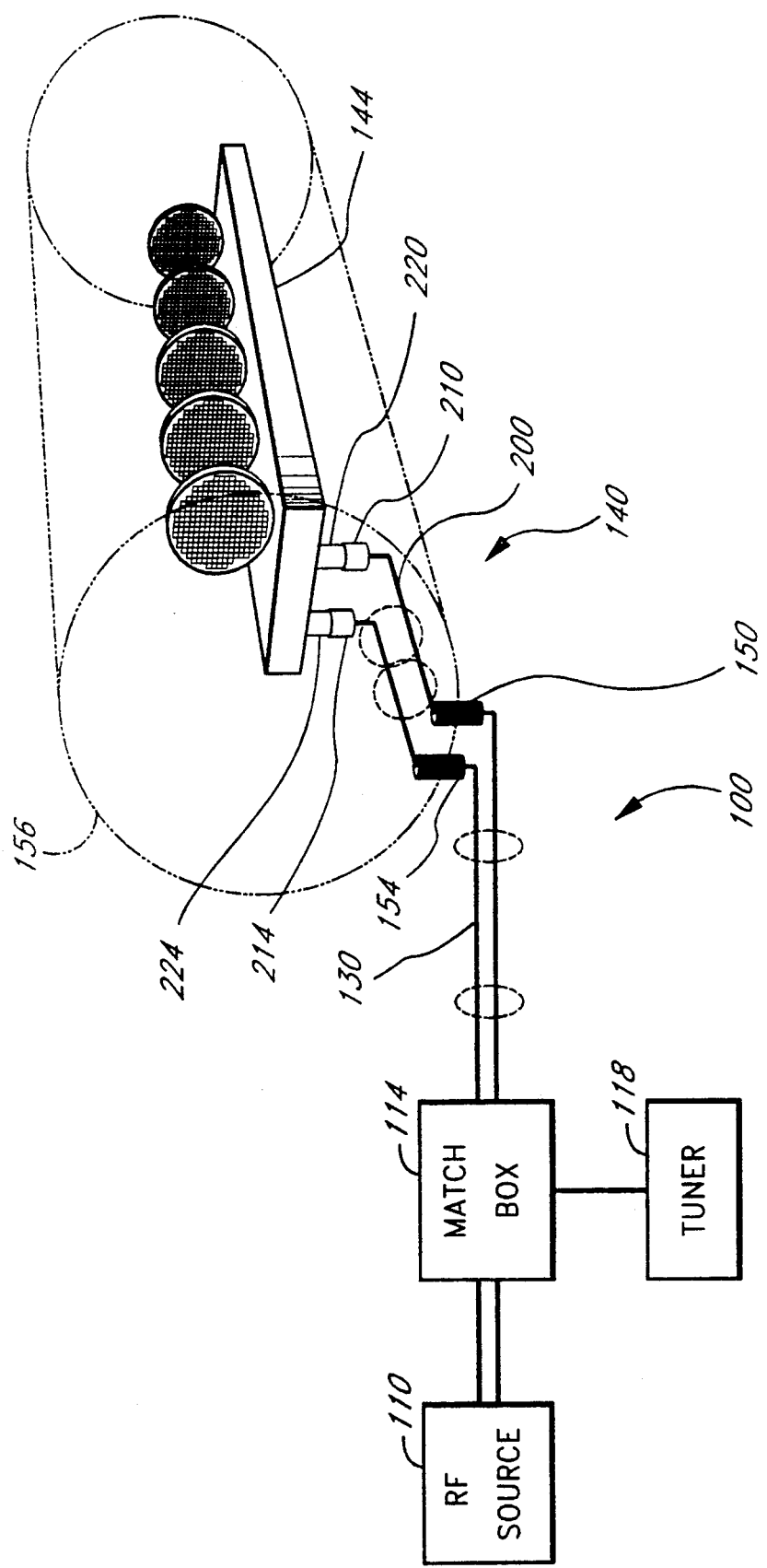
FIG. 1 is a pictorial block diagram of the electronic circuit of the present invention showing a first transmission line between the source of high frequency power and the feedthrough into the reactant tube and a second transmission line from feedthroughs to the boat assembly within the reactant tube.

As illustrated in FIG. 1, an electronic circuit 100 for providing high frequency power to the reactant system includes a conventional source of electrical power 110 which provides an output voltage at, for example, 13.56 MHz. The output voltage is provided as an input to a commercially available match box 114, which is controlled by a conventional tuner 118. The match box 114 and the tuner 118 operate together in a conventional manner to provide an output voltage. The match box 114 and the tuner 118 can be adjusted in a known manner so that the output impedance characteristics of the match box 114 can be tuned to the characteristics of a transmission line 130 which is connected to the output of the match box 114. The transmission line 130 is uniquely configured in accordance with the present invention to efficiently conduct the electrical power output from the match box 114 to a reactant tube 140. The reactant tube 140 is a conventional reactant tube which houses a removable boat assembly 144. Such a boat assembly 144 is described, for example, in U.S. Pat. No. 4,799,451.

Figure 2:
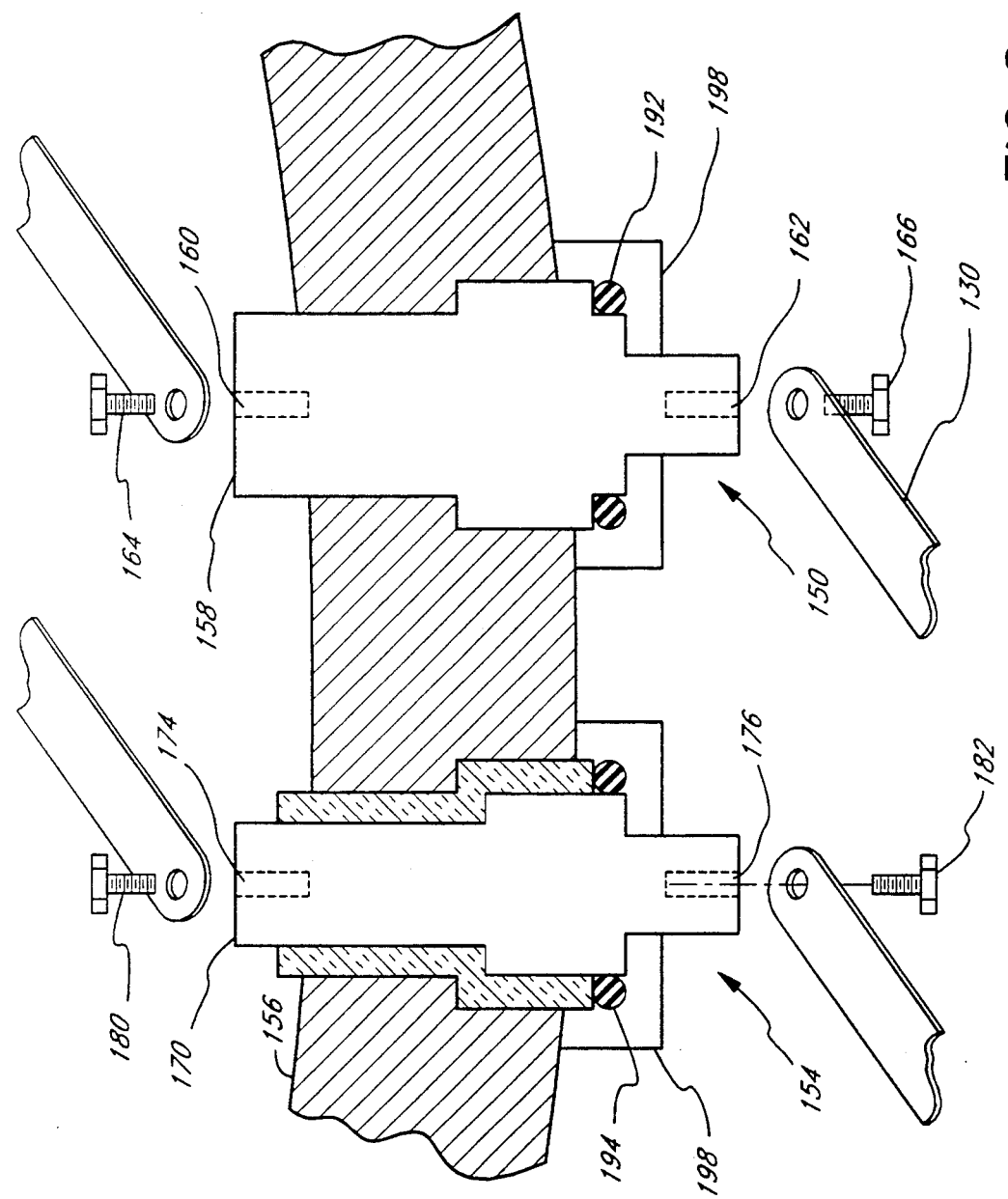
FIG. 2 is an enlarged view of the feedthroughs in the wall of the reactant tube of FIG. 1.

The reactant tube 140 includes a first feedthrough 150 and a second feedthrough 154 which are also constructed in accordance with the present invention. The two feedthroughs 150, 154 penetrate through an outer wall 156 of the reactant tube 140 so that electrical energy can be conducted therethrough while maintaining the integrity of the outer wall 156 of the reactant tube 140 so that a reactant gas within the tube 140 is confined therein. As illustrated in more detail in FIG. 2, the first feedthrough 150 comprises a cylindrical rod 158 of nickel, for example, that is electrically connected to the metallic outer wall 156 of the reactant tube 140. In one embodiment, the portion of the cylindrical rod 158 extending into the reactant tube 140 has a diameter of approximately one-half inch. The first feedthrough 150 has threaded holes 160, 162 in each end that receive respective electrically conductive screws 164, 166. Similarly, the second feedthrough 154 comprises a cylindrical rod 170 of nickel which is also advantageously one-half inch, or smaller, in diameter, and which has threaded holes 174, 176 in each end to receive respective electrically conductive screws 180, 182. Unlike the first feedthrough 150, the second feedthrough 154 includes a cylindrical sleeve 190 of ceramic, or other suitable material, that surrounds the nickel rod 170 and electrically isolates the nickel rod 170 from the outer wall 156 of the reactant tube 140. For example, ceramic sleeve 190 advantageously has a thickness of approximately one-eighth inch. The two feedthroughs are sealed with respect to the outer walls by respective O-rings 192, 194 and flanges 196, 198.

As illustrated, a second transmission line 200 interconnects the first and second feedthroughs 150, 154 and the boat assembly 144. A pair of contacts 210, 214 on the second transmission line 200 are positioned to be electrically and mechanically in contact with a corresponding pair of contacts 220, 224 of the boat assembly 144. The boat assembly 144 is removable from the reactant tube 140 by lifting the boat assembly 144 so that the two pairs of contacts 210, 214 and 220., 224 disengage.

Figure 3:
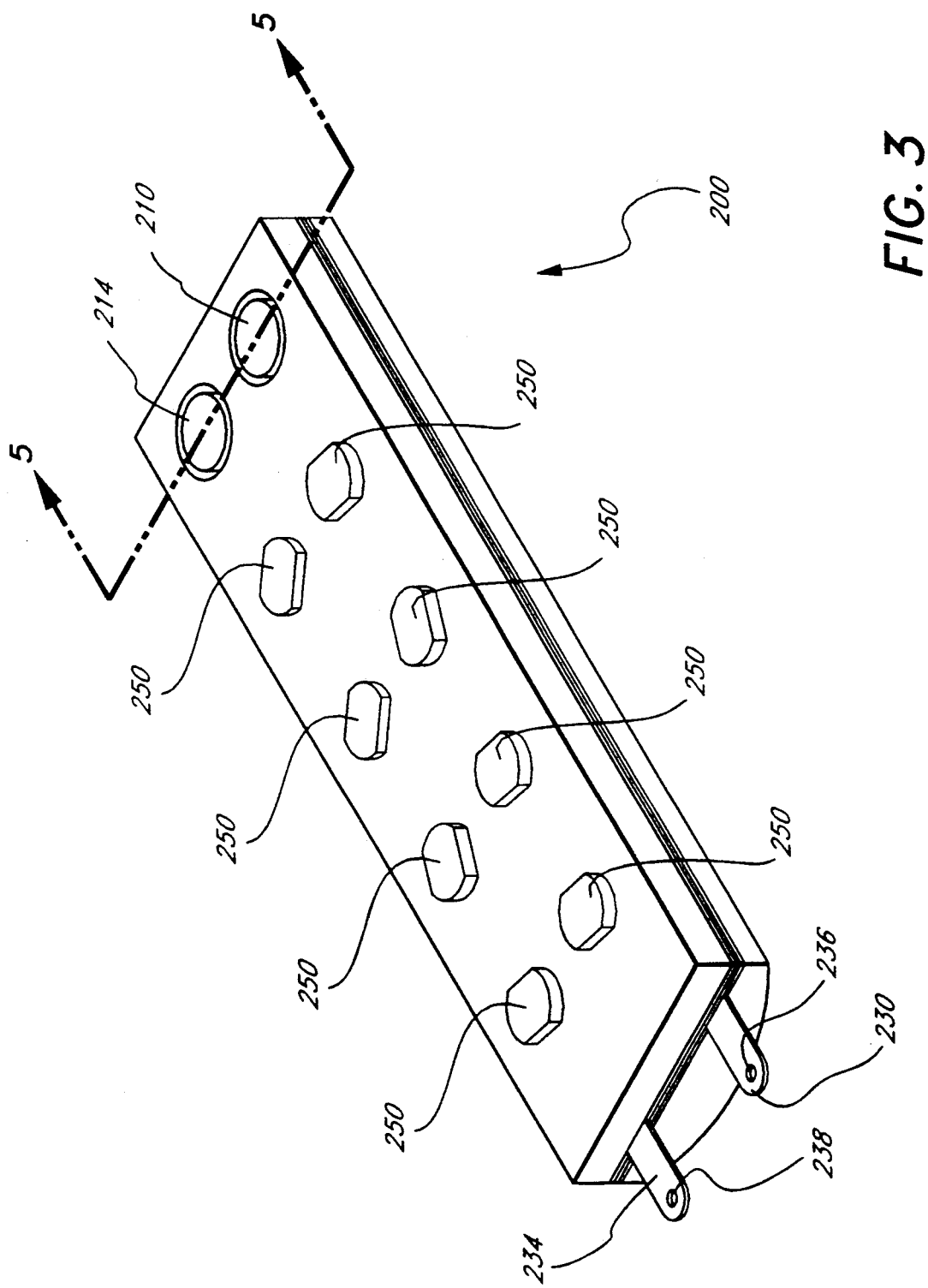
FIG. 3 is a perspective view of the transmission line between the feedthroughs and the boat assembly.

Referring now to FIG. 3, the second transmission line 200 is illustrated in more detail. As illustrated, the transmission line 200 has a bar shaped configuration, which, in the preferred embodiment, is approximately 2.75 inches wide and approximately 0.6 inches thick. The bottom of the transmission line 200 has a curvature which is selected to generally conform with the curvature of the inner surface of the reactant tube 140 so that the transmission line 200 will rest on the inner surface in a stable configuration. The pair of contacts 210 and 214 are shown as being circular and they are flush with the upper surface of the transmission line 200. The transmission line 200 includes a second pair of contacts 230, 234 which protrude from the transmission line 200 at the opposite end from the pair of contacts 210, 214. The second pair of contacts 230, 234 have respective holes 236, 238 which receive the screws 164, 180 which engage the holes 160, 174 of the first and second feedthroughs 150, 154 so that the contacts 230, 234 can be secured in good electrical contact with the feedthroughs 150, 154.

As will be seen below, the transmission line 200 comprises a sandwich of ceramic and nickel. A plurality of ceramic bolts 250 penetrate the transmission line 200 to secure the sandwiched materials together as one unit.

Figure 4:
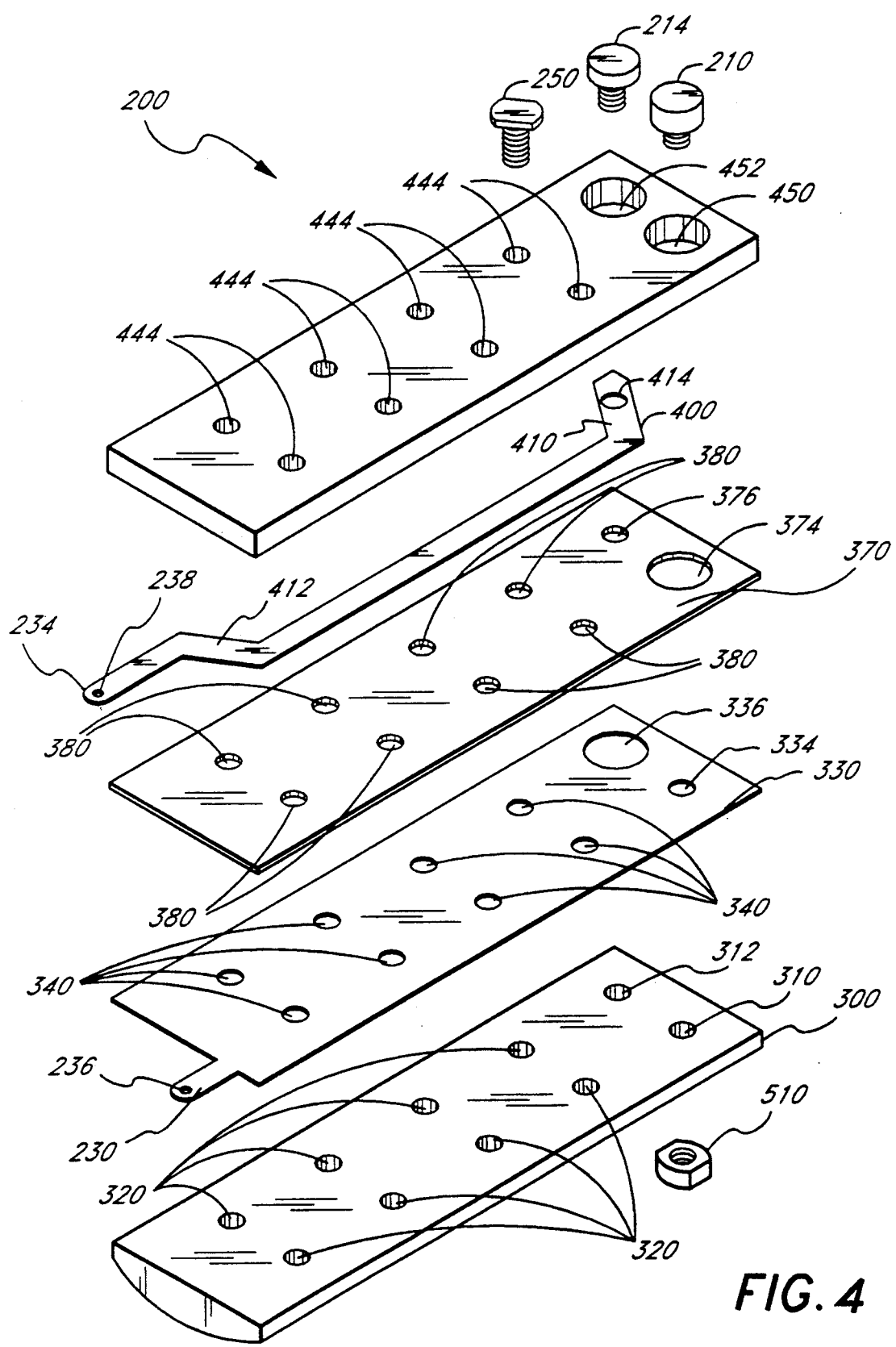
FIG. 4 is an exploded view of the transmission line of FIG. 3 showing additional details of the upper and lower electrodes.

An exploded view of the second transmission line 200 is shown in FIG. 4. As illustrated, the transmission line 230 includes a bottom plate 300 comprising ceramic (alumina) or another suitable insulating material. The bottom plate 300 comprises a pair of through holes 310 and 312. The bottom plate 300 also comprises a plurality of threaded holes 320. As will be seen below, the threaded holes 320 receive the ceramic bolts 250. For example, the holes 320 advantageously have a 5/16-18 UNC-1B thread. The bottom plate 300 has a width of approximately 2.75 inches and a maximum depth of approximately 0.4 inches. The length of the bottom plate 300 is selected to span the distance between the feedthroughs 150, 154 and the contacts 220, 224 on the boat assembly 144.

The transmission line 200 further includes a first or bottom conductor 330. The bottom conductor 330 comprises nickel or other suitable material, and, in the embodiment described herein, has a thickness of approximately 0.010 inches (10 mils). The bottom conductor 300 has a preferred width of approximately 2.70 inches and is thus slightly less wide than the bottom plate 300. The bottom conductor 330 has a first hole 334 which has a diameter of approximately 0.28 inches and a second hole 336 which has a diameter of approximately 0.625 inches. The first hole 334 and the second hole 336 are aligned with the holes 310, 312, respectively of the bottom plate 300. The bottom conductor 330 further includes a plurality of holes 340 that are aligned with the holes 320 in the bottom plate 300. For example, the holes 340 advantageously have a diameter of approximately 0.332 inches. The bottom conductor 330 is generally rectangular but has a protrusion that extends beyond the length of the bottom plate 300. The protrusion corresponds to the contact 230 of FIG. 3 and includes the hole 236 which has a diameter of approximately 0.188 inches.

The transmission line 200 includes an inner plate 370 of ceramic or another suitable insulating material which is positioned over the bottom conductor 330. The inner plate 370 preferably has a thickness of approximately 0.065 inches (65 mils). The inner plate 370 has a first hole 374 that has a diameter of approximately 0.625 inches and a second hole 376 that has a diameter of approximately 0.281 inches. The inner plate 370 also includes a plurality of holes 380 that are aligned with the holes 320 and 340. The holes 380 preferably have diameters of approximately 0.332 inches.

The transmission line 200 includes a top conductor 400 that is preferably constructed from a 0.010 inch thick plate of nickel, or other suitable material. The top conductor 400 has a width of approximately 1.00 inch and is generally straight with a first angled portion 410 at one end and a second angled portion 412 at the opposite end. In the completed assembly, the top conductor 400 is positioned on top of the inner ceramic plate 370 centered between the holes 380. The first angled portion is 410 positioned so that it is directly over the hole 376 in the inner ceramic plate 370. The first angled portion 410 has a hole 414 formed therein that is aligned with the hole 376. the hole 410 has a diameter of approximately 0.281 inches. A portion of the second angled end 412 protrudes beyond the length of the bottom plate 300 and forms the contact 234 of FIG. 3. The hole 238 is formed therein and has a diameter of approximately 0.188 inches. The top conductor 400 is electrically isolated from the bottom conductor 330 by the inner ceramic plate 370.

The transmission line 200 includes a top plate 440 that is substantially similar to the inner plate 370 and has substantially the same dimensions and thickness as the inner plate 370. A plurality of holes 444 are formed in the top plate 440 that correspond to the holes 380 in the inner plate 370. A first hole 450 in the top plate 440 has a diameter of approximately 0.625 inches and is aligned with the hole 374 in the inner plate 370. A second hole 452 in the top plate 440 also has a diameter of approximately 0.625 inches and is aligned with the hole 376.

Figure 5:
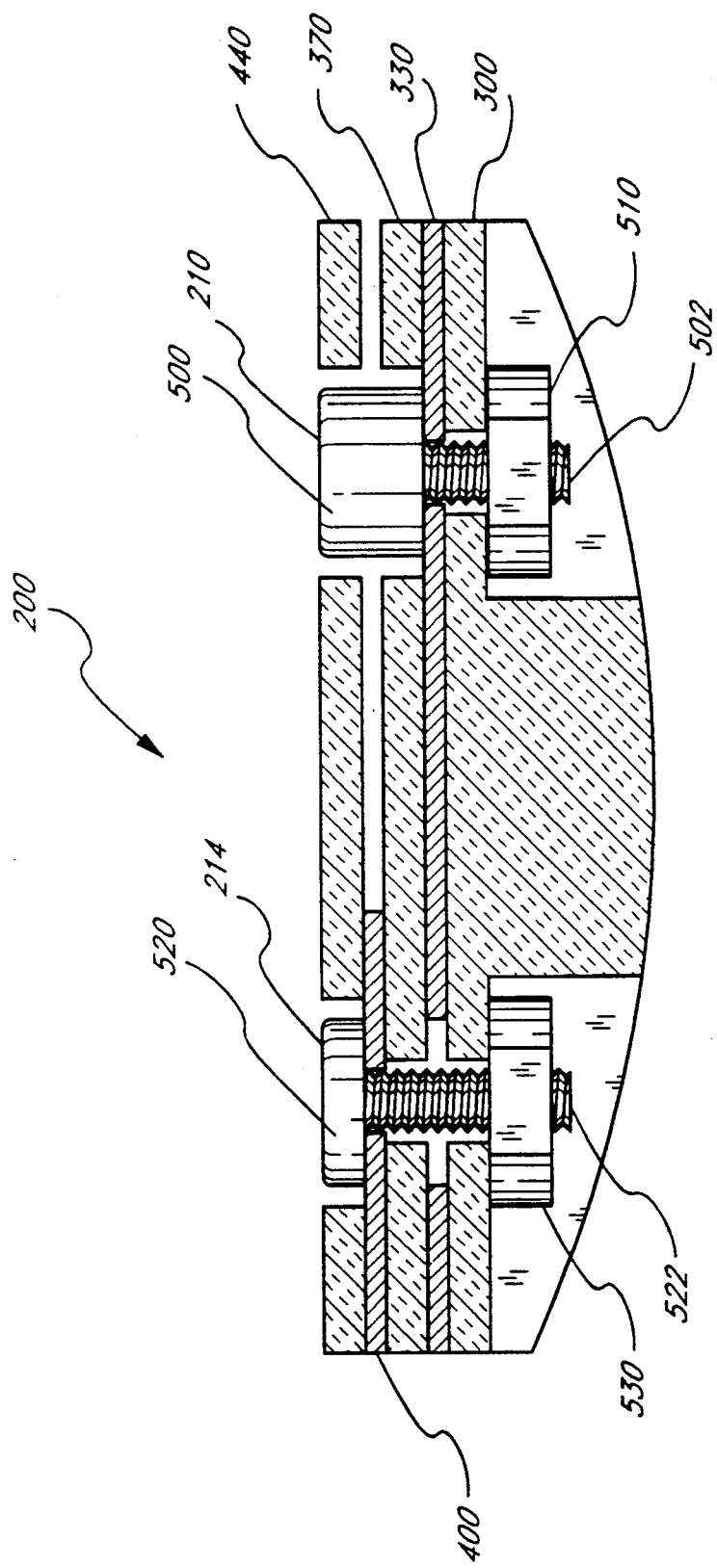
FIG. 5 is a cross-sectional view of the contact portion of the transmission line taken along the lines 5—5 in FIG. 3.

FIG. 5 illustrates a cross section of the transmission line taken along the lines 5—5 in FIG. 3. As illustrated, the first contact 210 comprises a graphite bolt that is electrically conductive. The first contact 210 includes a head portion 500 and a threaded shaft 502. The head portion 500 penetrates the top ceramic plate 440 and the inner ceramic plate 370 and rests on the bottom conductor 330 to make electrical contact therewith. The shaft 502 penetrates the inner ceramic plate 370, the bottom conductor 330 and the bottom ceramic plate 300. A portion of the bottom ceramic plate 300 is removed proximate to the shaft 502 to accommodate a threaded ceramic nut 510 that is tightened onto the shaft 502 to provide secure electrical contact between the head portion 500 and the bottom conductor 330. The height of the head portion 500 is selected so that it protrudes slightly above the surface of the top ceramic plate 440. For example, in the preferred embodiment, the head portion 500 has a height of approximately 0.103 inches.

The second contact 214 is also a graphite bolt that includes a head portion 520 and a threaded shaft 522. The head portion 520 penetrates the upper ceramic plate 440 and rests on the top conductor 400. The shaft 522 penetrates the top conductor 400, the inner ceramic plate 370, the bottom conductor 330 and the bottom ceramic plate 300. A portion of the bottom ceramic plate 300 is removed to accommodate a ceramic nut 530 that is tightened onto the shaft to provide secure electrical contact between the head portion 520 and the top conductor 400. The height of the head portion 520 is selected so that it protrudes slightly above the surface of the top ceramic plate 440. For example, in the preferred embodiment, the head portion 520 has a height of approximately 0.176 inches.

When the transmission line is assembled, the ceramic bolts 250 are passed through the holes in the upper ceramic plate 370, the inner ceramic plate 370 and the bottom conductor 330 to engage the holes 320 in the bottom ceramic plate 300. The bolts 250 are tightened to maintain the layers of the transmission line sandwich in fixed relationship with each other.

When constructed according to the foregoing description, the transmission line 200 has an impedance of approximately 11.0 ohms. This impedance substantially matches the known impedance of a plate boat (not shown). On the other hand, when the thickness of the inner ceramic plate 370 is reduced to approximately 0.027 inches (27 mils), the impedance is reduced to approximately 3.5 ohms which is the nominal impedance of an exemplary disc boat, such as illustrated in FIG. 1. The impedance can be varied by selecting the thickness of the inner ceramic plate 370.

The first transmission line 130 is constructed in a similar manner with appropriate configurations for making contact with the match box 114 and with the outside connections to the feedthroughs 150 and 154. The first transmission line 130 is constructed to have substantially the same impedance characteristics so that the impedance is matched throughout the length of the power delivery path from the match box 114 to the boat assembly 144.

What is claimed is:

1. A plasma enhanced chemical vapor deposition apparatus for processing workpieces within a chamber for containing the chemical vapor and workpieces positioned in a boat assembly, comprising:
   a source of RF excitation power positioned exterior of the chamber;
   a pair of spaced electrical conductors extending from said source and into said chamber;
   an RF power transmission line extending from said conductors within said chamber to a position to be electrically connected to an electrical circuit within a boat assembly to be positioned within said chamber, said circuit including a plurality of spaced members against which the workpieces are placed when being exposed to plasma enhanced chemical vapor, the electrical impedance of said line being matched to the electrical impedance of the boat assembly circuit to optimize the effectiveness of the RF plasma generated between said members within said chamber.

2. The apparatus of claim 1, wherein said transmission line comprises a pair of spaced, thin, flat electrically conductive elements separated by a thin layer of an insulating material, said elements being respectively connected to said conductors and being adapted to be electrically connected to electrical connector on said boat.

3. The apparatus of claim 2, wherein one of said elements is narrower than the other element and is centrally positioned with respect to the other element.

4. The apparatus of claim 3, including a pair of thick layers of an insulating material between which said elements are sandwiched.

5. The apparatus of claim 4, wherein said insulating material is ceramic.

6. The apparatus of claim 2, wherein said insulating material is a dielectric.

7. The apparatus of claim 6, wherein said dielectric material is ceramic.

8. The apparatus as defined in claim 7, wherein said ceramic is alumina.

9. The apparatus as defined in claim 1, wherein said RF transmission line is formed so as to generally conform to the inner surface of said chamber.

10. A method of improving the deposition rate and uniformity on workpieces in a plasma enhanced chemical vapor deposition system, said deposition system including a boat assembly for holding said workpieces in said plasma, said boat assembly having a first predetermined impedance at a selected frequency, said method comprising the steps of:
    connecting an internal transmission line to said boat assembly within said deposition system, said internal transmission line having an impedance which substantially matches said first predetermined impedance of said boat assembly;
    connecting said internal transmission line to an external transmission line, said external transmission line having substantially the same first predetermined impedance as said internal transmission line at said selected frequency;
    providing an RF voltage source having an output frequency equal to said selected frequency, and having a second predetermined impedance; and
    matching said first predetermined impedance of said external transmission line and said second predetermined impedance of said RF source.

11. The method as defined in claim 10, wherein said matching step comprises the steps of:
    providing a match box and a match box tuner, said match box having input and output terminals, said tuner controlling the output impedance of said output terminals;
    connecting said RF source to said input terminals of said match box;
    connecting said external transmission line to said output terminals of said match box; and
    adjusting said tuner to tune said match box so that the output impedance of said output terminals is substantially equal to said first predetermined impedance.

12. The method as defined in claim 10, wherein said selected frequency is 13.56 megahertz.

13. The method as defined in claim 10, wherein said first predetermined impedance of said internal transmission line is approximately 11 ohms.

* * * * *